(12) United States Patent
Dowling et al.

(10) Patent No.: US 9,136,477 B2
(45) Date of Patent: Sep. 15, 2015

(54) LIGHT EMISSIVE DEVICE

(75) Inventors: Mark Dowling, Elsworth (GB); Richard Wilson, Girton (GB)

(73) Assignee: CDT OXFORD LIMITED, Cambridgeshire (GB)

( * ) Notice: Subject to any disclaimer, the term of this patent is extended or adjusted under 35 U.S.C. 154(b) by 1396 days.

(21) Appl. No.: 12/158,969

(22) PCT Filed: Dec. 19, 2006

(86) PCT No.: PCT/GB2006/004767
§ 371 (c)(1),
(2), (4) Date: Sep. 19, 2008

(87) PCT Pub. No.: WO2007/071969
PCT Pub. Date: Jun. 28, 2007

(65) Prior Publication Data
US 2009/0072722 A1    Mar. 19, 2009

(30) Foreign Application Priority Data

Dec. 23, 2005    (GB) .................................... 0526393.4

(51) Int. Cl.
| | | |
|---|---|---|
| H01J 1/62 | (2006.01) |
| C09K 11/02 | (2006.01) |
| H01L 51/00 | (2006.01) |
| C09K 11/06 | (2006.01) |
| H01L 51/50 | (2006.01) |
| H05B 33/14 | (2006.01) |

(52) U.S. Cl.
CPC ............ *H01L 51/0039* (2013.01); *C09K 11/06* (2013.01); *H01L 51/0038* (2013.01); *H01L 51/0043* (2013.01); *H01L 51/5036* (2013.01); *H05B 33/14* (2013.01); *C09K 2211/1007* (2013.01); *C09K 2211/1029* (2013.01); *C09K 2211/1092* (2013.01); *C09K 2211/1425* (2013.01); *C09K 2211/1433* (2013.01); *C09K 2211/1458* (2013.01); *C09K 2211/1483* (2013.01); *C09K 2211/1491* (2013.01); *C09K 2211/185* (2013.01)

(58) Field of Classification Search
USPC .......................................................... 428/690
See application file for complete search history.

(56) References Cited

U.S. PATENT DOCUMENTS

| | | | |
|---|---|---|---|
| 4,539,507 A | | 9/1985 | VanSlyke et al. |
| 5,405,709 A | * | 4/1995 | Littman et al. ................ 428/690 |

(Continued)

FOREIGN PATENT DOCUMENTS

| | | |
|---|---|---|
| EP | 0707020 B1 | 8/2000 |
| EP | 0947123 B1 | 2/2002 |

(Continued)

OTHER PUBLICATIONS

Wu et al. Microelectronics Journal 35 (2004) 343-348.*

(Continued)

*Primary Examiner* — J. L. Yang
(74) *Attorney, Agent, or Firm* — Brooks Kushman P.C.

(57) ABSTRACT

An organic light emissive device, which comprises: an anode; a cathode; and an organic light emissive region between the anode and the cathode, which region comprises a polymeric electroluminescent material; wherein the emission from the polymeric electroluminescent material is color shifted by the presence of a color shifting unit in the polymer.

23 Claims, 3 Drawing Sheets

(56) References Cited

U.S. PATENT DOCUMENTS

| | | | |
|---|---|---|---|
| 5,683,823 A | 11/1997 | Shi et al. | |
| 5,723,873 A | 3/1998 | Yang | |
| 5,798,170 A | 8/1998 | Zhang et al. | |
| 5,807,627 A | 9/1998 | Friend et al. | |
| 6,127,693 A | 10/2000 | Chen et al. | |
| 6,268,695 B1 | 7/2001 | Affinito | |
| 6,353,083 B1 | 3/2002 | Inbasekaran et al. | |
| 6,899,963 B1 * | 5/2005 | Zheng et al. | 428/690 |
| 7,052,351 B2 * | 5/2006 | Tutt et al. | 445/24 |
| 7,075,231 B1 * | 7/2006 | Liao et al. | 313/506 |
| 7,252,893 B2 * | 8/2007 | Ricks et al. | 428/690 |
| 2002/0117662 A1 | 8/2002 | Nii | |
| 2002/0182441 A1 | 12/2002 | Lamansky et al. | |
| 2004/0137263 A1 * | 7/2004 | Burn et al. | 428/690 |
| 2005/0013289 A1 | 1/2005 | Tanimoto | |
| 2005/0218799 A1 * | 10/2005 | Hamada | 313/506 |
| 2006/0093852 A1 * | 5/2006 | Marsitzky et al. | 428/690 |

FOREIGN PATENT DOCUMENTS

| | | | | |
|---|---|---|---|---|
| EP | 1245659 A1 | 10/2002 | | |
| EP | 0901176 B1 | 10/2003 | | |
| EP | 0880303 B1 | 1/2004 | | |
| EP | 1434284 A2 | 6/2004 | | |
| EP | 0949850 B1 | 8/2004 | | |
| EP | 1528611 A2 | 5/2005 | | |
| GB | 2348316 A | 9/2000 | | |
| JP | 2002/324679 A | 11/2002 | | |
| WO | 90/13148 A1 | 11/1990 | | |
| WO | 97/05184 A1 | 2/1997 | | |
| WO | 98/10621 A1 | 3/1998 | | |
| WO | 98/57381 A1 | 12/1998 | | |
| WO | 99/48160 A1 | 9/1999 | | |
| WO | 00/46321 A1 | 8/2000 | | |
| WO | 00/48258 A1 | 8/2000 | | |
| WO | 00/53656 A1 | 9/2000 | | |
| WO | 00/55927 A1 | 9/2000 | | |
| WO | 01/19142 A1 | 3/2001 | | |
| WO | 01/42331 A1 | 6/2001 | | |
| WO | WO 01/42331 * | 6/2001 | | C08G 61/02 |
| WO | 01/62869 A1 | 8/2001 | | |
| WO | 01/81649 A1 | 11/2001 | | |
| WO | 02/44189 A1 | 6/2002 | | |
| WO | 02/45466 A1 | 6/2002 | | |
| WO | 02/066552 A1 | 8/2002 | | |
| WO | 02/068435 A1 | 9/2002 | | |
| WO | 02/81448 A1 | 10/2002 | | |
| WO | 02/84759 A1 | 10/2002 | | |
| WO | 03/095586 A1 | 11/2003 | | |
| WO | WO 03/102109 A1 * | 12/2003 | | C09K 11/06 |
| WO | 2005/030827 A1 | 4/2005 | | |

OTHER PUBLICATIONS

International Search Report for PCT/GB2006/004767.

Chen et al., Bright White Polymer Double-Layer LEDs, 2000, Polymer Preprints, American Chemical Society, vol. 41, No. 1, pp. 835-836.

Gong et al., Multilayer Polymer Light-Emitting Diodes: White-Light Emission with High Efficiency, 2005, Advanced Materials, vol. 17, pp. 2053-2058.

Bernius et al., Progress with Light-Emitting Polymers, Dec. 1, 2000, Advanced Materials, vol. 12, No. 23, pp. 1737-1750.

Niu et al., Light Annealing Below the Glass Transition Temperature: A General Way to Increase Performance of Light-Emitting Diodes Based on Copolyfluorenes, Jul. 22, 2002, Applied Physics Letters, vol. 81, No. 4, p. 634-636.

Yang et al., Efficient Polymer Light Emitting Diodes with Metal Fluoride/Al Cathodes, Jul. 30, 2001, Applied Physics Letters, vol. 79, No. 5, 563-565.

Yang et al., Efficient Blue Polymer Light-Emitting Diodes from a Series of Soluble Poly(paraphenylene)s, Jan. 15, 1996, Journal of Applied Physics, vol. 79, No. 2, pp. 934-939.

Setayesh et al., Bridging the Gap Between Polyfluorene and Ladder-Poly-p-phenylene: Synthesis and Characterization of Poly-2,8-indenofluorene, 2000, Macromolecules, vol. 33, No. 6, pp. 2016-2020.

Yang et al., Deep-Red Electroluminescent Polymers: Synthesis and Characterization of New Low-Band-Gap Conjugated Copolymers for Light-Emitting Diodes and Photovoltaic Devices, 2005, Macromolecules, vol. 38, No. 2, pp. 244-253.

Yamamoto, Electrically Conducting and Thermally Stable π-Conjugated Poly(arylene)s Prepared by Organometallic Processes, 1992, Progress in Polymer Science, vol. 17, pp. 1153-1205.

Wu et al., Recent Development of Polyfluorene-Based RGB Materials for Light Emitting Diodes, Apr. 2004, Microelectronics Journal, vol. 35, No. 4, Advanced Materials and Devices for Large Area Electronics, pp. 343-348.

Zhan et al., Synthesis and Fluorescence of Polymeric Triphenylamine Obtained by Oxidative-Coupling Polymerization, Jun. 24, 2002, Journal of Applied Polymer Science, vol. 85, No. 13, pp. 2718-2724.

Horhold et al., MEH-PPV and Thianthrene-Containing PPV-Derivatives as Efficient Polymeric Materials for Solid-State Lasers, 2002, Proceedings of SPIE, Organic Light-Emitting Materials and Devices V, vol. 4464, pp. 317-328.

* cited by examiner

LIGHT EMISSIVE DEVICE

The present invention relates to organic light emissive devices, to methods of making such devices and the use of such devices in lighting applications.

Organic light emissive devices (OLEDs) generally comprise a cathode, an anode and an organic light emissive region between the cathode and the anode. Light emissive organic materials may comprise small molecular materials such as described in U.S. Pat. No. 4,539,507 or polymeric materials such as those described in PCT/WO90/13148. The cathode injects electrons into the light emissive region and the anode injects holes. The electrons and holes combine to generate photons.

Figure 1:
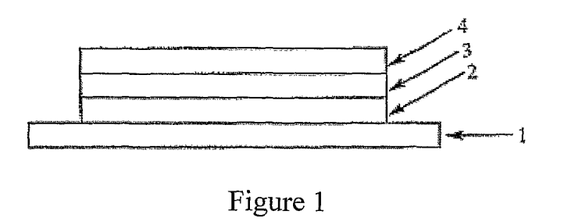
FIG. 1 shows a typical cross section of an OLED.

FIG. 1 shows a typical cross-sectional structure of an OLED. The OLED is typically fabricated on a glass or plastics substrate 1 coated with a transparent anode 2 such as an indium-tin-oxide (ITO) layer. The ITO coated substrate is covered with at least a layer of a thin film of an electroluminescent organic material 3 and cathode material 4 of low work function metal such as calcium is applied, optionally with a capping layer of aluminium (not shown). Other layers may be added to the device, for example to improve charge transport between the electrodes and the electroluminescent material.

There has been a growing interest in the use of OLEDs in display applications because of their potential advantages over conventional displays. OLEDs have relatively low operating voltage and power consumption and can be easily processed to produce large area displays. On a practical level, there is a need to produce OLEDs which are bright and operate efficiently but which are also reliable to produce and stable in use.

OLEDs may also be used in lighting applications, such as backlights for flat panel displays. Here, there is particular interest in producing OLEDs which emit white light. However, whilst proposals have been made to fabricate OLEDs capable of producing light with CIE coordinates approximating to white, the present applicants are not aware of such OLEDs being successfully fabricated for practical use.

U.S. Pat. No. 5,807,627 describes early work on electroluminescent devices having multiple layers. Devices exemplified in U.S. Pat. No. 5,807,627 incorporate polyarylene vinylene polymers such as poly(p-phenylene vinylene), PPV. The device configurations described in U.S. Pat. No. 5,807,627 show colours of emission from red to yellow/green. No examples of white light emission were demonstrated.

U.S. Pat. No. 5,683,823 is concerned with an electroluminescent device having a fluorescent emitting layer including a red emitting material dispersed in host material that emits in the blue green regions so that the light produced is said to be substantially white.

U.S. Pat. No. 6,127,693 provides a light-emitting diode (LED) which can emit near white light. The organic light-emitting layer of the device contains a blend of a blue light emitting poly(paraphenylene vinylene) and a red light emitting alkoxy substituted PPV derivative such that the LED can emit sun light-like yellowish white light.

Chen et al in Polymer Preprints, 41, 835 (2000) describes light emitting diodes which are purported to emit white light. Double-layer devices are described which include a doped blue-green polymer layer adjacent a cross-linked hole transport layer which emits in red by charge trapping. The blue/green layer consists of 9,9-bis(2'-ethyl hexyl)-polyfluorene (DERF) which is doped with a green fluorescent dye pyrromethene 546 (Py546). The presence of the green dopant dye is required to achieve the white emission reported as a combination of three distinct emissions in blue, green and red.

US 2005/013289 is said to provide a white organic light emitting device. A host having blue luminescence property and a guest having one of orange and red luminescence properties are doped into the emission layer. A material having green luminescence property is included in the electron transport layer.

EP 1434284 is concerned with white light-emitting organic electroluminescent devices. The devices include at least two organic electroluminescent (EL) materials and at least one photoluminescent (PL) material. In paragraph [0043] the combination of blue and red EL materials and a green PL material is disclosed to produce white light.

Gong et al, in Advanced Materials, 17, 2053-2058 (2005), discloses multilayer white-light-emitting PLEDs fabricated by using a blend of luminescent semiconducting polymers and organometallic complexes as the emission layer.

In summary of the above, it is known to try to produce white light by mixing blue and red emitters. However, this results in colours that have too low CIEy. In order to improve the colour, it is known to add a green emitter. However, green emitters used to date have been found to decay quickly leading to an unacceptable colour shift of the device over its lifetime.

Accordingly, a need exists for an organic light emissive device which is sufficiently stable and operates at a level of efficiency suitable for practical use as a white light source for lighting applications.

The present invention at least partially solves this problem. In a first aspect, the present invention provides an organic light emissive device, which comprises:
- an anode;
- a cathode; and
- an organic light emissive region between the anode and the cathode, which region comprises an electroluminescent material; wherein the emission from the electroluminescent material is colour shifted by the presence of a non-emitting colour shifting unit in the organic light emissive region.

Preferably, the electroluminescent material comprises an electroluminescent molecule including the colour shifting unit. Most preferably, the electroluminescent material comprises an electroluminescent polymer including the colour shifting unit.

Colour shifting of the emission from the blue electroluminescent material or the red electroluminescent material may be measured by reference to the EL spectra (measured in the solid state) of the electroluminescent material in the absence of and in the presence of the colour shifting unit. The degree of shifting may be measured in relation to the observed shift in the peak emission. The degree of shifting may also be measured by reference to the observed long wavelength edge shift or short wavelength edge shift.

Each of the red and blue electroluminescent materials emits light by exciton radiative decay upon charge carrier injection. Some exciton decay from the blue may transfer to the red and induce emission in the red by the process known as Forster transfer.

For the purposes of the present invention, a blue electroluminescent material may be defined as an organic material that by electroluminescence emits radiation having a wavelength in the range of 400-500 nm, more preferably 430-500 nm. For the purposes of the present invention, blue emission may be defined as light having a CIE x co-ordinate less than or equal to 0.25, more preferably less than or equal to 0.2, and a CIE y co-ordinate less than or equal to 0.25, more preferably less than or equal to 0.2, most preferably having CIE coordinates (0.15, 0.20).

For the purposes of the present invention, a red electroluminescent material may be defined as an organic material that by electroluminescence emits radiation having a wavelength in the range of 600-750 nm, preferably 600-700 nm, more preferably 610-650 nm and most preferably having an emission peak around 650-660 nm. For the purposes of the present invention, red emission may be defined as light having a CIE x co-ordinate greater than or equal to 0.4, preferably 0.64, and a CIE y co-ordinate less than or equal to 0.4, preferably 0.33.

Preferably, the observed colour of the combined emission from the red and blue electroluminescent materials in the presence of the colour shifting unit is white or near-white. White light can be defined as the radiation emitted by a black body at 3000-9000K or as radiation having CIE coordinates (0.31, 0.33). In this case, it will be understood by the skilled person that a straight line drawn between the first and second CIE coordinates of emission from the red and blue electroluminescent materials, respectively, in the presence of the colour shifting unit will pass through the region of white or near white light.

Typically, the device comprises a two emissive component system such that no other emissive materials, other than the red and blue electroluminescent materials, are present. In this regard, the device typically does not contain a green electroluminescent material. Further, it is preferred that the blue light electroluminescent material is not doped with an emissive dopant.

Preferably, the colour shifting unit is present in whichever of the blue or red electroluminescent material is colour shifted i.e. the blue or red electroluminescent material comprises the colour shifting unit. However, this is not essential and the colour shifting unit may be comprised in a separate material to whichever of the blue or red electroluminescent material is colour shifted. A single material may comprise the colour shifting unit, the red electroluminescent material, and the blue electroluminescent material.

Figure 2A:
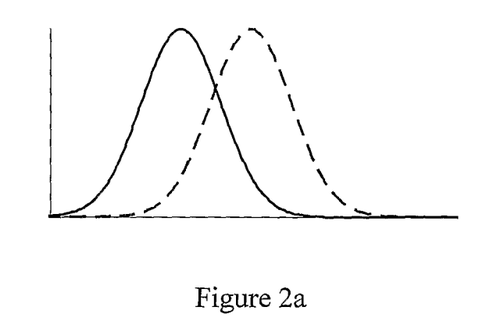
FIG. 2a shows the colour shift in emission according to the present invention.
Figure 2B:
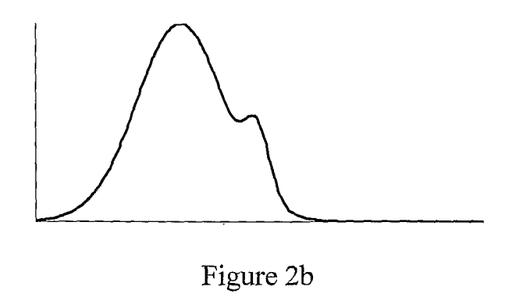
FIG. 2b shows the effect of a second emission peak on an EL spectra in the presence of a second emitter.

It will be understood that the non-emitting colour shifting unit shifts the frequency of emission from the red or blue electroluminescent material. This is shown in FIG. 2a. This may be contrasted with other structural units which themselves may emit light so that the colour of light viewed by the naked eye appears colour shifted (see FIG. 2b)

Preferably, the colour shifting unit green shifts the colour of emission.

Preferably, the colour shifting unit comprises a stilbene unit:

The stilbene unit may be substituted or unsubstituted.

Preferred concentrations of the colour shifting unit are 1 to 20% by monomer ratio of repeat units, preferably 5 to 15%, most preferably 10%.

Preferably, the blue electroluminescent material comprises a blue electroluminescent polymer, more preferably a conjugated polymer, typically a copolymer. Preferably, the polymer is solution processable. Preferably, the blue electroluminescent material is fluorescent.

The blue electroluminescent material is preferably a semiconductive polymer and may comprise a triarylamine repeat unit. Particularly preferred triarylamine repeat units are shown in formulae 1-6:

wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl. The repeat unit of formula 4 is most preferred. Any two phenyl groups of repeat units 1-6 may be linked by a direct bond or by a divalent moiety, preferably a heteroatom, more preferably O or S. In the case where units are linked, linkage of phenyl repeat units in the polymer backbones of units 1-3 is most preferred.

More preferably, the blue electroluminescent polymer is a copolymer, in particular an intrinsic blue electroluminescent copolymer, comprising one or more repeat units of formulae 1-6, most preferably a repeat unit of formula 4, and at least one arylene repeat unit. Particularly preferred arylene repeat units are as described above with respect to the longer wavelength emitter.

Preferably, the red electroluminescent material comprises a red electroluminescent polymer, more preferably a conjugated polymer, typically a copolymer. Preferably, the polymer is solution processable. Red electroluminescent polymers having a shallow LUMO level, for example greater less than 2.5 eV are preferred. This aids electron transport in the device.

A shallow LUMO red fluorescent material may comprise a copolymer of a fluorene repeat unit as described anywhere herein and a Se-containing repeat unit. The Se-containing repeat unit may comprise formula 52:

(52)

wherein X is O, S, Se, $CR_2$, $SiR_2$ or NR, more preferably O, S or Se; and each R is independently alkyl, aryl or H. The repeat unit of formula (52) may be substituted or unsubstituted. A preferred substituent for the repeat unit of formula (52) is $C_{1-20}$ alkyl which may be present on one or more of the rings of the repeat unit of formula (52).

Such a shallow LUMO red fluorescent material is known, for example from Macromolecules 2005, 38, 244-253.

Red phosphorescent materials are desirable choices as shallow LUMO red electroluminescent materials. Preferably, a red phosphorescent material comprises a dendrimer comprising a core, and one or more conjugated dendrons comprising surface groups. However, this is not essential and a red phosphorescent material may comprise a red phosphorescent small molecule, for example a metal (M) surrounded by three bidentate ligands, or a red phosphorescent linear polymer.

The solution processability of dendrimers is extremely adaptable as the surface groups that the control the processing properties can be modified independently of the light emitting core.

A red phosphorescent material may comprise a metal complex. Preferred metal complexes comprise optionally substituted complexes of formula (53):

(53)

wherein M is a metal; each of $L^1$, $L^2$ and $L^3$ is a coordinating group; q is an integer; r and are each independently 0 or an integer; and the sum of $(a \cdot q)+(b \cdot r)+(c \cdot s)$ is equal to the number of coordination sites available on M, wherein a is the number of coordination sites on $L^1$, b is the number of coordination sites on $L^2$ and c is the number of coordination sites on $L^3$.

A red phosphorescent material may have formula (54) or (55):

(54)

(55)

where M represents a metal and R represents H, a substituent group, or a dendron comprising a surface group.

When the red phosphorescent material is a small molecule, R represents H or a substituent group. Examples of substituent groups include solubilising groups such as $C_{1-20}$ alkyl or alkoxy; electron withdrawing groups such as fluorine, nitro or cyano; and substituents for increasing glass transition temperature (Tg) of the polymer.

R may represent a dendron having a surface group such that the red emitting material is a dendrimer.

Preferably, the red phosphorescent dendrimer has formula (56) or (57):

(56)

(57)

where M and R are as defined above and R' represents H or a surface group.

Examples of surface groups R' include solubilising groups such as $C_{1-20}$ alkyl or alkoxy; electron withdrawing groups such as fluorine, nitro or cyano; and substituents for increasing glass transition temperature (Tg) of the polymer.

Preferably, R' represents an alkyl or alkoxy group, preferably C1 to C20 alkyl or alkoxy, more preferably.

M may represent any suitable metal, in particular a d-block metal such as those in rows two and three i.e. elements 39 to 48 and 72 to 80, in particular ruthenium, rhodium, palladium, rhenium, osmium, iridium, platinum, tungsten and gold. Preferably, M represents iridium (Ir).

"Ligand" or "L" in formulae 53 to 57 may represent a carbon or nitrogen donor such as porphyrin or a bidentate ligand of formula (58):

(58)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

Each of $Ar^4$ and $Ar^5$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

The red phosphorescent dendrimer may have formula (59) or (60):

where R=2-ethyl,hexyl.

Any suitable host material may be used with the red phosphorescent material. The host material may be a small molecule or a polymer. It is preferred that the host material is a polymer, more preferably a conjugated polymer.

The concentration of the red emitting material in the polymer host may be sufficient so that emission from the polymer host is not visible. The concentration of the red emitting material in the polymer host may be greater that 7.5 wt %. The concentration of the red emitting material in the polymer host may be at least 10 wt %.

The concentration of the red emitting material in the polymer host may be sufficient so that emission from the polymer host is visible.

Preferred red and blue electroluminescent polymers are substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

The red electroluminescent material may be a separate material to the blue electroluminescent material. In this case, the red and blue electroluminescent materials may be blended together in the organic light emissive region. The blue electroluminescent material may act as a host to the red electroluminescent material, when the red electroluminescent material is a red phosphorescent material.

Alternatively, the red and blue electroluminescent materials may be comprised in separate sub-layers of the organic light emissive region. In this case, the blue electroluminescent material also may perform the function of transporting holes to the red electroluminescent material, or vice versa.

A hole transporting layer comprising hole transporting material may be present between the anode and the organic light emissive region. Suitable materials for the hole transporting material include hole transporting polymers, particularly polymers comprising a triarylamine repeat unit. Preferred triarylamine repeat units include those having general formulae 1 to 6.

Particularly preferred hole transporting polymers of this type are AB copolymers of a fluorene repeat unit and a triarylamine repeat unit.

In a first embodiment, emission from the blue electroluminescent material is colour shifted by the colour shifting unit.

Preferably, the emission from the blue electroluminescent material is green shifted. In this regard, the peak emission preferably is shifted by from 10 to 40 nm, more preferably by from 15 to 35 nm, still more preferably by from 20 to 30 nm. The long wavelength edge preferably is shifted by from 10 to 35 nm, more preferably from 20 to 25 nm. The short wavelength edge preferably is shifted by from 0 to 16 nm, preferably from 4 to 16 nm, more preferably from 8 to 12 nm.

In this embodiment, the emission from the colour shifted blue electroluminescent material preferably has CIE coordinates (0.15<x<0.3, 0.3<y<0.45), more preferably (0.18<x<0.25, 0.36<y<0.44), most preferably (0.22, 0.4)). In this embodiment, the emission from the colour shifted blue electroluminescent material preferably has a wavelength in the range of 420 to 520 nm, more preferably 450 to 520 nm. The emission colour could be described as cyan.

In this first embodiment, the red and blue electroluminescent materials preferably are separate materials, typically blended together in the organic light emissive region. Preferably, the organic light emissive region is a layer having a thickness in the range 65-70 nm.

The blue electroluminescent material may be any suitable material. In this first embodiment, the blue electroluminescent material preferably comprises the colour shifting unit. Preferably, the blue electroluminescent material comprises a polymer and the colour shifting unit is comprised in the backbone of said polymer, for example as shown below in general formula 7:

(7)

Other repeat units may be present in the polymer shown above in general formula 7. For example, the polymer may further contain one or more different arylene or heteroarylene repeat units such as fluorene repeat units (preferably substituted 2,7 linked fluorene repeat units) for example having general formula 8:

(8)

wherein $R^1$ and $R^2$ are independently selected from hydrogen or optionally substituted alkyl, alkoxy, aryl, arylalkyl, het- eroaryl and heteroarylalkyl. More preferably, at least one of $R^1$ and $R^2$ comprises an optionally substituted $C_4$-$C_{20}$ alkyl or aryl group.

Other arylene repeat units include poly(arylene vinylenes) such as poly(p-phenylene vinylenes); 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein. Preferably, the blue electroluminescent material comprises concentrations of the colour shifting unit of 1 to 20% by monomer ratio of repeat units, preferably 5 to 15%, most preferably 10%. Preferably, the blue electroluminescent material comprises 1 to 30 mol % blue light emissive unit. Preferably, the blue electroluminescent material comprises 3 to 10 mol % of one or more different fluorene repeat units.

Preferred blue light emissive units are as shown above in general formula 1 to 6.

Preferred red light emissive materials include polymers comprising an optionally substituted repeat unit of formula (I):

(I)

wherein $X^1$, $Y^1$ and $Z^1$ are each independently O, S, $CR_2$, $SiR_2$ or NR, more preferably O or S, most preferably S; and each R is independently alkyl, aryl or H. A preferred substitutent for the repeat unit of formula (I) is $C_{1-20}$ alkyl which may be present on one or more of the rings of the repeat unit of formula (I).

More preferably, the red emissive material is a copolymer comprising an optionally substituted repeat unit of formula (I) and an arylene co-repeat unit selected from optionally substituted 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred arylene repeat units comprise optionally substituted, 2,7-linked fluorenes, most preferably repeat units of formula II:

(II)

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

In the first embodiment, as compared with a previously known three component blend of red, green and blue electroluminescent materials, it has been found that more stable white emission and significantly longer device lifetime is obtained from the combined emission from the blended red electroluminescent material and blue-green (colour shifted blue) electroluminescent material. DC and pulsed device lifetime have been observed to increase for a device according to the invention with combined emission from a blended red electroluminescent material and blue-green electroluminescent material as compared with a known three component blend of red, green and blue electroluminescent materials.

The more stable white emission may be attributed to the longer lifetime of the green-blue polymer under both pulsed and dc conditions and to the emission spectra of the green-blue polymer changing significantly less during the operational lifetime of the device. For a three component blend of red, green and blue electroluminescent materials the emissive colour tends to change significantly, becoming bluer due to a reduction in the relative emission of the red and especially the green components.

In a second embodiment, emission from the red electroluminescent material is colour shifted by the colour shifting unit.

Preferably, the emission from the red electroluminescent material is green shifted. As described above, the degree of shifting may be measured by reference to the EL spectra of the red electroluminescent material in the absence of and in the presence of the colour shifting unit. In this regard, the peak emission preferably is shifted by from 5 to 30 nm, preferably 5 to 15 nm more preferably by from 8 to 12 nm, still more preferably by about 10 nm. The long wavelength edge preferably is shifted by from 3 to 12 nm, more preferably from 5 to 10 nm. The short wavelength edge preferably is shifted by from 12 to 23 nm, more preferably from 15 to 20 nm.

In this embodiment, the emission from the colour shifted red electroluminescent material preferably has CIE coordinates around (0.64, 0.33) and more preferably around (0.60, 0.38). The emission colour could be described as red-orange.

In this second embodiment, it is preferred that the blue electroluminescent material comprises the colour shifting unit. In this regard, a preferred blue electroluminescent material comprises a polymer, said polymer having a backbone comprising a plurality of the colour shifting units and side chains pendant from the backbone comprising blue light emissive units, for example said polymer may comprise a repeat unit as shown below in general formula 9:

(9)

The blue light emissive unit preferably comprises a triarylamine.

In this second embodiment, the red electroluminescent material may be any suitable material.

The device according to the first aspect of the invention may be used in a backlight for a flat panel display as well as for other lighting applications, in particular as a source of ambient lighting.

In a second aspect of the present invention there is provided an electroluminescent material comprising a blue or red electroluminescent material and a non-emitting colour shifting unit, as described anywhere above in relation to the first aspect. The use of the electroluminescent material for emitting light also is provided.

The present invention now will be described in more detail with reference to the attached figures, in which:

FIG. 3 shows the colour shift resulting from the incorporation of the stilbene repeat unit as described in relation to Example 1a.

With reference to FIG. 1, the architecture of an electroluminescent device according to the invention comprises a transparent glass or plastic substrate 1, an anode 2 of indium tin oxide and a cathode 4. An organic light emissive region 3 is provided between anode 2 and cathode 4.

Further layers may be located between anode 2 and cathode 3, such as charge transporting, charge injecting or charge blocking layers.

In particular, it is desirable to provide a conductive hole injection layer formed of a doped organic material located between the anode 2 and the electroluminescent layer 3 to assist hole injection from the anode into the layer or layers of semiconducting polymer. Examples of doped organic hole injection materials include poly(ethylene dioxythiophene) (PEDT), in particular PEDT doped with polystyrene sulfonate (PSS) as disclosed in EP 0901176 and EP 0947123, or polyaniline as disclosed in U.S. Pat. No. 5,723,873 and U.S. Pat. No. 5,798,170.

If present, a hole transporting layer located between anode 2 and electroluminescent layer 3 preferably has a HOMO level of less than or equal to 5.5 eV, more preferably around 4.8-5.5 eV.

If present, an electron transporting layer located between electroluminescent layer 3 and cathode 4 preferably has a LUMO level of around 3-3.5 eV.

The organic light emissive region 3 may consist of the colour shifting unit, blue electroluminescent material, and red electroluminescent material or may comprise these in combination with one or more further materials. In particular, these may be blended with hole and/or electron transporting materials as disclosed in, for example, WO 99/48160. Alternatively, the blue and/or red electroluminescent material may be covalently bound to a charge transporting material.

Cathode 4 is selected from materials that have a workfunction allowing injection of electrons into the organic light emissive region. Other factors influence the selection of the cathode such as the possibility of adverse interactions between the cathode and the organic light emissive region. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

In a practical device, at least one of the electrodes is semi-transparent in order that light may be absorbed (in the case of a photoresponsive device) or emitted (in the case of an OLED). Where the anode is transparent, it typically comprises indium tin oxide. Examples of transparent cathodes are disclosed in, for example, GB 2348316.

The embodiment of FIG. 1 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

A polymer comprising a fluorene repeat unit may provide one or more of the functions of hole transport, electron transport and emission depending on which layer of the device it is used in and the nature of co-repeat units. Preferred fluorene repeat units are optionally substituted 2,7-linked fluorenes, for example having general formula 8.

In particular:
- a homopolymer of a fluorene repeat unit, such as a homopolymer of 9,9-dialkylfluoren-2,7-diyl, may be utilised to provide electron transport.
- a copolymer comprising a fluorene unit and a triarylamine repeat unit, in particular a repeat unit selected from formulae 1-6, may be utilised to provide hole transport and/or emission.
- a copolymer comprising a fluorene unit and heteroarylene repeat unit may be utilised for charge transport or emission. Preferred heteroarylene repeat units are selected from formulae 10-24:

10 wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

11

12

13

14

15

16

17

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Preferred methods for preparation of these polymers are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

A single polymer or a plurality of polymers may be deposited from solution to form a layer. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

EXAMPLE 1

(a) Preparation of a Colour Shifted Blue Electroluminescent Polymer

A comparative blue electroluminescent polymer as described in WO 03/095586 was prepared by Suzuki polymerisation as described in WO 00/53656 using diboronic esters and dibromo monomers of 9,9-diphenylfluorene and 9,9-dioctylfluorene and 5 mol % of Monomer 1 below. A colour shifted blue electroluminescent polymer was prepared by the same method, except that 10 mol % of fluorene monomers were replaced with 10 mol % of colour shifting Monomer 2 below.

Monomer 1

Monomer 2

Figure 3:
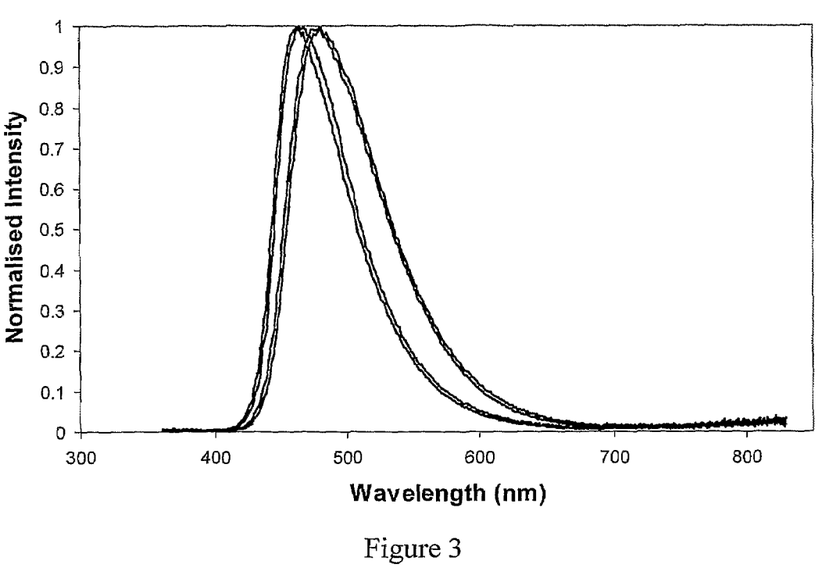

The colour shift can be seen from the results in FIG. 3, which compares the EL spectra of the blue electroluminescent material and the colour shifted blue (cyan) electroluminescent material.

(b) Preparation of a White Emitting Device Using Bi-Blend System According to the Invention A red electroluminescent polymer comprising 9,9-dialkylfluorene repeat units, benzothiadiazole repeat units, triarylamine repeat units and red emitting repeat units derived from Monomer 3, as disclosed in WO 00/46321, was prepared by Suzuki polymerisation as described in WO 00/53656.

Monomer 3

Poly(ethylene dioxythiophene)/poly(styrene sulfonate) (PEDT/PSS), available from H C Starck of Leverkusen, Germany as Baytron P® was deposited over an indium tin oxide anode supported on a glass substrate (available from Applied Films, Colorado, USA) by spin coating. A hole transporting layer of F8-TFB (shown below) is deposited over the PEDT/PSS layer by spin coating from xylene solution to a thickness of about 10 nm and heated at 180° C. for 1 hour. A blend of the colour shifted blue electroluminescent polymer and red electroluminescent polymer in a 99.5:0.5 ratio is deposited over the layer of F8-TFB by spin-coating from xylene solution to a thickness of around 65 nm. A Ba/Al cathode is formed over the polymer by evaporating a first layer of barium to a thickness of up to about 10 nm and a second layer of aluminium barium to a thickness of about 100 nm over the semiconducting polymer. Finally, the device is sealed using a metal enclosure containing a getter that is placed over the device and glued onto the substrate in order to form an airtight seal.

"F8-TFB"

The invention claimed is:

1. An organic light emissive device for providing white light, which comprises:
   an anode;
   a cathode; and
   an organic light emissive region between the anode and the cathode, which region comprises an electroluminescent material comprising a polymer which emits blue light, and an electroluminescent material which emits red light, and a colour shifting unit, wherein the blue or red light emitted is colour shifted by the colour shifting unit comprising a color shifting unit component material forming a copolymer with at least one of the polymer which emits blue light or the electroluminescent material which emits red light, the copolymer having a monomer repeat ratio of the color-shifting unit component material to the polymer or the electroluminescent material ranging from 1 to 20%, and in which the red light emitting electroluminescent material has a shallow LUMO level of less than 2.5 eV, and
   wherein the colour shifting unit comprises a stilbene unit.

2. A device according to claim 1, wherein the colour of the combined emission from the red and blue light emitting electroluminescent materials in the presence of the colour shifting unit is white radiation having CIE coordinates (0.31, 0.33).

3. A device according to claim 1, wherein no emissive materials, other than the red and blue light emitting electroluminescent materials, are present.

4. A device according to claim 1, wherein the colour shifting unit green shifts the colour of emission from at least one of the blue emitting electroluminescent polymer and red emitting electroluminescent material.

5. A device according to claim 1, wherein the red light emitting electroluminescent material comprises a red phosphorescent material.

6. A device according to claim 1, wherein the red light emitting electroluminescent material comprises a polymer.

7. A device according to claim 1, wherein a hole transporting layer comprising hole transporting material is present between the anode and the organic light emissive region.

8. A device according to claim 1, wherein emission from the blue emitting electroluminescent polymer is colour shifted by the colour shifting unit.

9. An organic light emissive device for providing white light, which comprises:
   an anode;
   a cathode; and
   an organic light emissive region between the anode and the cathode, which region comprises an electroluminescent material comprising a polymer which emits blue light, and an electroluminescent material which emits red light, and a colour shifting unit, wherein the blue or red light emitted is colour shifted by the colour shifting unit comprising a color shifting unit component material forming a copolymer with at least one of the polymer which emits blue light or the electroluminescent material which emits red light, the copolymer having a monomer repeat ratio of the color-shifting unit component material to the polymer or the electroluminescent material ranging from 1 to 20%, and in which the red light emitting electroluminescent material has a shallow LUMO level of less than 2.5 eV, and wherein the colour shifting unit comprises a stilbene unit, wherein emission from the blue emitting electroluminescent polymer is colour shifted by the colour shifting unit, and wherein the peak emission from the blue emitting electroluminescent polymer is green shifted by from 15 to 35 nm.

10. A device according to claim 8, wherein the emission from the colour shifted blue emitting electroluminescent polymer has CIE coordinates (0.28<x<0.32, 0.30<y<0.38).

11. A device according to claim 1, wherein the red and blue light emitting electroluminescent materials are separate materials, blended together forming a mixture in the organic light emissive region.

12. A device according to claim 8, wherein the colour shifting unit is comprised in the backbone of said blue light emitting electroluminescent polymer.

13. An organic light emissive device for providing white light, which comprises:

an anode;

a cathode; and an organic light emissive region between the anode and the cathode, which region comprises an electroluminescent material comprising a polymer which emits blue light, and an electroluminescent material which emits red light, and a colour shifting unit, wherein the blue or red light emitted is colour shifted by the colour shifting unit comprising a color shifting unit component material forming a copolymer with at least one of the polymer which emits blue light or the electroluminescent material which emits red light, the copolymer having a monomer repeat ratio of the color-shifting unit component material to the polymer or the electroluminescent material ranging from 1 to 20%, and in which the red light emitting electroluminescent material has a shallow LUMO level of less than 2.5 eV, wherein emission from the blue emitting electroluminescent polymer is colour shifted by the colour shifting unit, wherein the colour shifting unit is comprised in the backbone of said blue light emitting electroluminescent polymer, and wherein the backbone of said polymer contains a blue light emissive repeat unit selected from a group consisting of general formula 1 to 6:

wherein X, Y, A, B, C and D are independently selected from H or a substituent group.

14. A device according to claim 1, wherein emission from the red electroluminescent material is colour shifted by the colour shifting unit.

15. A device according to claim 14, wherein the peak emission from the red electroluminescent material is green shifted by from 8 to 12 nm.

16. A device according to claim 14, wherein the emission from the colour shifted red electroluminescent material has CIE coordinates (0.58<x<0.64, 0.33<y<0.40).

17. A device according to claim 14, wherein the blue light emitting electroluminescent polymer comprises the colour shifting unit.

18. An organic light emissive device for providing white light, which comprises:

an anode;

a cathode; and an organic light emissive region between the anode and the cathode, which region comprises an electroluminescent material comprising a polymer which emits blue light, and an electroluminescent material which emits red light, and a colour shifting unit, wherein the blue or red light emitted is colour shifted by the colour shifting unit comprising a color shifting unit component material forming a copolymer with at least one of the polymer which emits blue light or the electroluminescent material which emits red light, the copolymer having a monomer repeat ratio of the color-shifting unit component material to the polymer or the electroluminescent material ranging from 1 to 20%, and in which the red light emitting electroluminescent material has a shallow LUMO level of less than 2.5 eV, wherein emission from the red electroluminescent material is colour shifted by the colour shifting unit, wherein the blue light emitting electroluminescent polymer comprises the colour shifting unit, and wherein the blue light emitting electroluminescent polymer comprises a repeat unit of general formula 9:

(9)

19. A device according to claim 5 in which the red phosphorescent material comprises a dendrimer comprising a core, and one or more conjugated dendrons comprising surface groups.

20. A device according to claim 5 in which the red phosphorescent material comprises a red phosphorescent small molecule.

21. A device according to claim 5 in which the red phosphorescent material comprises a red phosphorescent linear polymer.

22. An organic light emissive device for providing white light, which comprises:
an anode;
a cathode; and
an organic light emissive region between the anode and the cathode, which region comprises an electroluminescent material comprising a polymer which emits blue light, and an electroluminescent material which emits red light, and a colour shifting unit, wherein the blue or red light emitted is colour shifted by the colour shifting unit comprising a color shifting unit component material forming a copolymer with at least one of the polymer which emits blue light or the electroluminescent material which emits red light, the copolymer having a monomer repeat ratio of the color-shifting unit component material to the polymer or the electroluminescent material ranging from 1 to 20%, and in which the red light emitting electroluminescent material has a shallow LUMO level of less than 2.5 eV, and wherein the colour shifting unit comprises a stilbene unit, wherein the red light emitting electroluminescent material comprises a red phosphorescent material, and wherein the red phosphorescent material comprises an optionally substituted metal complex of formula (53):

(53)

wherein M is a metal; $L^1$ is a coordinating group having coordination sites of number a, $L^2$ is a coordinating group having coordination sites of number b, and $L^3$ is a coordinating group having coordination sites of number c; a, b, c and q are integers; r and s are each independently 0 or an integer; and the sum of (q)+(r)+(s) is equal to the number of coordination sites available on M, wherein q is the number of coordination sites on $L^1$, r is the number of coordination sites on $L^2$ and s is the number of coordination sites on $L^3$.

23. A device according to claim 5 in which the red phosphorescent material comprises a material having the formula (54) or (55):

(54)

(55)

where M represents a metal and R represents H, a substituent group, or a dendron comprising a surface group.

* * * * *